United States Patent [19]

Schoenbach et al.

[11] Patent Number: 4,916,303
[45] Date of Patent: Apr. 10, 1990

[54] ELECTRON BEAM CONTROLLED BULK SEMICONDUCTOR SWITCH WITH CATHODOLUMINESCENT ELECTRON ACTIVATION

[75] Inventors: Karl H. Schoenbach, Norfolk; Vishnukumar K. Lakdawala, Virginia Beach; Ralf P. Brinkmann; Glenn A. Gerdin, both of Norfolk, all of Va.

[73] Assignee: Center for Innovative Technology, Herndon, Va.

[21] Appl. No.: 351,218

[22] Filed: May 15, 1989

Related U.S. Application Data

[63] Continuation-in-part of Ser. No. 184,680, May 16, 1989, Pat. No. 4,831,248, which is a continuation-in-part of Ser. No. 82,546, Apr. 25, 1989, Pat. No. 4,825,061.

[51] Int. Cl.[4] .............................................. H01J 40/14
[52] U.S. Cl. ................................. 250/211 R; 250/211 J
[58] Field of Search ...................... 250/211 R, 211 J; 357/17, 19, 30 B, 30 M, 30 N

[56] References Cited

U.S. PATENT DOCUMENTS

| | | |
|---|---|---|
| 3,555,282 | 1/1971 | Vanai et al. ........................ 250/211 J |
| 3,832,732 | 8/1974 | Roberts ................................. 357/19 |
| 3,917,943 | 11/1975 | Auston ............................... 250/211 J |
| 4,001,865 | 1/1977 | Voss ....................................... 357/38 |
| 4,063,130 | 12/1977 | Hunter, Jr. ............................ 315/150 |
| 4,240,088 | 12/1980 | Myers ..................................... 357/19 |
| 4,376,285 | 3/1983 | Leonberger et al. .................. 357/17 |
| 4,396,833 | 8/1983 | Pan ..................................... 250/211 J |
| 4,438,331 | 3/1984 | Davis .................................. 250/211 J |
| 4,626,883 | 12/1986 | Kash ...................................... 357/30 |
| 4,626,884 | 12/1986 | Shannon ................................ 357/30 |
| 4,822,991 | 4/1989 | Riggs et al. ........................ 250/211 T |
| 4,825,061 | 4/1989 | Schoenbach et al. ........... 250/211 R |
| 4,831,248 | 5/1989 | Schoenbach et al. ........... 250/211 J |

Primary Examiner—David C. Nelms
Assistant Examiner—Stephone B. Allen
Attorney, Agent, or Firm—Staas & Halsey

[57] ABSTRACT

An electron beam controlled semiconductor switch is capable of carrying large currents without being restricted by the space charge limited current condition. The switch includes a block of semiconductor material having ohmic contacts connectable to first and second electrical conductors. Semi-insulating GaAs may be used as the semiconductor material. A shallow donor or acceptor doped layer may be formed at the surface receiving the electron beam for increased band-edge radiation. This recombination radiation ionizes, together with X-rays produced by Bremsstrahlung, the bulk of the semiconductor block to provide relatively high current density and current gain.

11 Claims, 3 Drawing Sheets

ELECTRON BEAM CONTROLLED BULK SEMICONDUCTOR SWITCH WITH CATHODOLUMINESCENT ELECTRON ACTIVATION

CROSS-REFERENCE TO RELATED APPLICATION

This is a continuation-in-part of U.S. patent application No. 7/184 680, issued as U.S. Pat. No. 4,831,248 on May 16, 1989, issued as U.S. Pat. No. 4,831,248, which is continuation of U.S. patent application Ser. No. 07/082,546, issued as U.S. Pat. No. 4,825,061 on Apr. 25, 1989.

BACKGROUND OF THE INVENTION

1. Field of the Invention

The present invention is related to electron beam controlled bulk semiconductor switches and, more particularly, to a switch which is not restricted by the space charge limited current condition and is capable of high current gain and high current density.

2. Description of the Related Art

Many varieties of optically controlled semiconductor switches exist, but electron beam controlled switches are less common. Photodiodes, phototransistors, photothyristors and light sensitive resistors are examples of the many types of optically controlled switches. The most commonly used light-sensitive semiconductor deice is the photodiode which is used in many applications, including fiber optic communication systems, etc. The currents handled by such devices are relatively low, typically in the milliampere range. One example is the PIN diode taught by U.S. Pat. No. 4,240,088 to Myers. Other light-activated devices include the thyristors taught by U.S. Pat. Nos. 3,832,732 to Roberts and 4,001,865 to Voss, the microwave switching circuit taught by U.S. Pat. No. 4,396,833 to Pan and many other patents. Some, such as U.S. Pat. No. 4,626,883 to Kash et al. and 3,917,943 to Auston, describe switching elements with picosecond switching times. Other light activated switches, such as those taught by U.S. Pat. No. 4,438,331 to Davis and 4,376,285 to Leonberqer et al., are able to carry a larger amount of current by making an entire block of semiconductor material conductive; however, like photodiodes, they require continuous light to sustain conduction.

Electron-bombarded semiconductor (EBS) devices are high-speed switching devices which use an electron beam instead of light to control switching. EBS devices typically use electron beams of 10–15 keV and are limited in output power and current density due to the space charge limited current condition. While switching time is typically below ten nanoseconds, the current density is usually a few milliamperes per square millimeter with a current gain of 2000 or less.

Higher current densities, up to $10^2$ A/cmz$^2$ are provided by diffuse discharge switches, such as the switch taught by U.S. Pat. No. 4,0643,130 to Hunter. However, while diffuse discharge switches can be turned ON in less than a nanosecond, they are relatively slow to turn OFF, taking approximately 100 nanoseconds and have a moderate current gain between $10^2$ and $10^3$.

SUMMARY OF THE INVENTION

An object of the invention is to provide a semiconductor switch with a current density of over $10^4$ A/cm$^2$.

Another object of the present invention is to provide a high current semiconductor switch with an operating voltage drop of less than 100 volts.

A further object of the present invention is to provide an electron beam controlled semiconductor switch with a current density unrestricted by the space charge limited current condition.

The above objects are attained by providing a vacuum tube switching device, comprising: first and second terminals; a block of direct semiconductor material with a first contact on a first surface connected to the first terminal, second contact on a second surface, opposite the first surface, connected to the second terminal and a doped region exposed by the first surface; electron beam means for directing an electron beam onto the first surface and into other doped region of said block to produce an electron-hole plasma between the first and second contacts by direct impact, recombination radiation and Bremsstrahlung, thereby permitting current to flow between the first and second terminals during irradiation of said block by the electron beam; and an enclosure, surrounding said block and said electron beam means, for maintaining pressure within said enclosure below atmospheric pressure, said first and second terminals extending beyond said enclosure.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Figure 1:
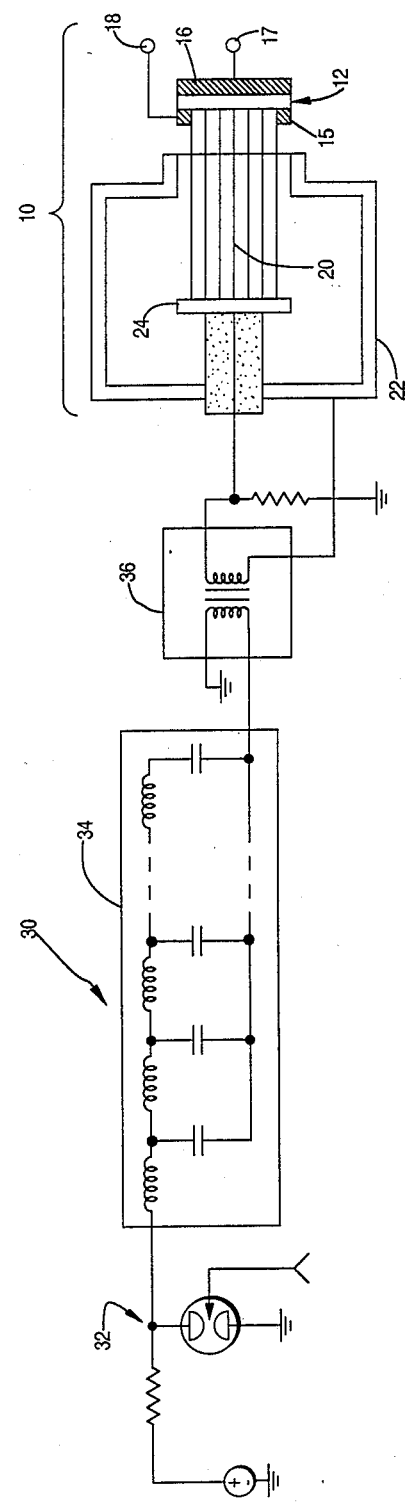
FIG. 1 is a schematic diagram of a first embodiment of the present invention.

As illustrated in FIG. 1, an electron beam controlled switch 10 according to the present invention includes a block 12 of semiconductor material with ohmic contacts 15–16 operatively connectable to the electrical conductors 17 and 18. A space of a micron to a few centimeters may be used to separate contact 15 from contact 16. An electron beam 20 is used to initiate and maintain conductivity in the switch 10. The electron beam 20 may be generated in a vacuum tube diode 22 which emits electrons from a cathode 24 through an anode foil 26. The electron beam 20 passes through the vacuum chamber wall and strikes the surface of the semiconductor block 12 through contact 15. Energization of the diode 22 may be controlled in a conventional manner. A pulsing circuit 30 is illustrated in FIG. 1 as including a spark gap switch 32, pulse forming network 34 and pulse transformer 36. A pulsing circuit like that illustrated in FIG. 1 has been used to produce a one microsecond pulse.

Figure 2A:
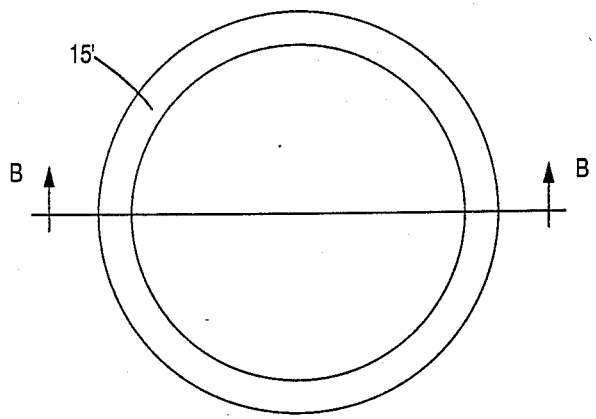
FIGS. 2A and 2B are a top and a cross-sectional side view of a semiconductor wafer with one ring-shaped contact, as used in a second embodiment of the present invention.
Figure 2B:
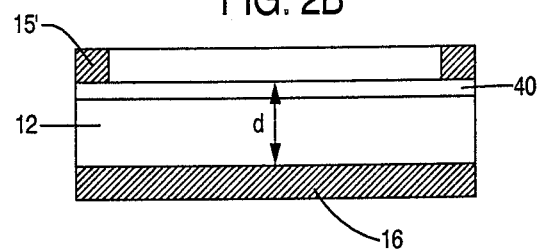

When the block 12 of semiconductor material is formed of a highly resistive direct semiconductor material, such as semi-insulating gallium arsenide (GaAs), the electron beam 20 has a maximum energy for GaAs of approximately 200 keV since GaAs can suffer damage if the electron energy exceeds 220 keV. The lower limit of the electron energy in the embodiment illustrated in FIG. 1 is determined by the fact that the electron beam has to pass through the anode foil 26 and the contact 15. However, where the semiconductor contact 15 forms the anode of the electron beam diode 26, electrons with much lower energies, even as low as 10 keV can potentially be used. Low energy electron beams are more easily used if, as illustrated in FIGS. 2A and 2B, a ring-shaped contact 15' is used instead of the solid contact illustrated in FIG. 1. Use of a ring-shaped contact requires that the highly conductive region formed by the electron beam at the surface of the block 12 of semiconductor material be able to serve as the inner portion of contact 15.

The range of electron energy for a device constructed according to the present invention is between the range of electron beams used in diffuse discharge switches (150–300 keV) and those used in electron-bombarded semiconductor (EBS) devices (10–15 keV). The capabilities of an electron-beam controlled bulk semiconductor switch according to the present invention is more similar to a diffuse discharge switch than an EBS device, because the space charge limited current condition is exceeded.

The space charge limitation is overcome in the present invention by converting the electron energy in the electron beam 20 into photon energy and X-rays (Bremsstrahlung). The photon energy is produced by band edge radiation due to radiative recombination of electron hole pairs produced by the electron beam. The X-rays and photon energy is then used to ionize the bulk of the semiconductor instead of only a shallow surface layer. The electron beam 20 penetrates the semiconductor material 12 to a relatively shallow depth. For example, a 10 keV electron beam will penetrate silicon to a depth of 1.5 micrometers. However, the X-rays and photon energy which is produced by higher energy electron beams can penetrate to a depth of one-half to one millimeters or more. The majority of the ionization in the semiconductor material 12 outside the electron-beam activated layer is preferably caused by photon energy. Unlike Bremsstrahlung which produces X-rays in a linear relationship to electron energy, photon energy produced by cathodoluminiscence is independent of the energy of the electron beam 20.

Preferably, the semiconductor material is a highly resistive direct semiconductor material such as semiinsulating gallium arsenide (GaAs) or semi-insulating indium phosphide (InP). A shallow donor or acceptor layer 40 (FIG. 2B) may be formed at the surface of the semiconductor material 12 adjacent to the electrode 15. The depth of doped layer 40 should be approximately equal to the depth to which the electrons penetrate the semiconductor 12. For example, a GaAs wafer 0.5 millimeter thick can be doped by diffusing zinc for 20 minutes at a temperature of 750° C. to produce a p-type layer of about 10 micrometers with an acceptor concentration of $10^{19}/cm^3$. Donor concentrations and acceptor concentrations of $10^{17}$ per cubic centimeter to $10^{20}$ per cubic centimeter can be used. Materials such as tellurium (Te), selenium (Se), tin (Sn), sulfur (S), silicon (Si) and germanium (Ge) can be used to produce donors in gallium arsenide and material such as zinc (ZN), cadmium (Cd), carbon (C), beryllium (Be), magnesium (Mg), and lithium (Li)can be used to produce acceptors in gallium arsenide (GaAs).

There are two reasons for doping the electron-beam activated region of the semiconductor switch with a shallow donor or acceptor material. First, the probability of direct recombination and thus the number of band-edge photons per incoming electron is increased by doping gallium arsenide with, e.g., zinc. Second, the bandgap energy of a semiconductor highly doped with suitable materials, such as GaAs doped with zinc, is reduced below the bandgap energy of the same semiconductor material which has not been doped. The band-edge radiation generated in the cathodo-luminescent layer has low photon energy and therefore can penetrate deeper into the semiconductor block 12.

As a result, a high-power semiconductor switch can be constructed with a thickness between the two contacts 15, 16 of 0.5 mm to 10 mm, provided the electron-beam radiated portion 40 of the semiconductor block 12 is properly doped. If the thickness d of the semiconductor block is approximately 1 cm, the electric field across the electrodes may be at least 150 kV/cm and may even be able to go as high as 400 kV/cm without significant current through the semiconductor block 12. For example, when the electron beam is off, an electric field of 150 kV/cm across the electrodes 15, 16 will produce a current of only 4 A/cm$^2$ for a thickness d of 1 cm. Thus a high hold-off voltage is obtained for such thick switches. When the electron beam irradiates the region 40, the electric field across the electrodes 15, 16 may be as high as 3 kV/cm for Ga As to produce current densities of 10 kA/cm$^2$.

In experiments performed using semiconductor material 12 formed as described above, the undoped semi-insulating GaAs exhibited current densities far above the space charge limited current density for a trap free insulator which represents the optimum condition for space charge limited current flow. The characteristics exhibited by the undoped semi-insulating GaAs indicate that the bulk of the semiconductor was ionized due to X-ray Bremsstrahlung. The experimental results using zinc-doped GaAs had a slower rise time than the undoped semi-insulating GaAs, but had approximately twice the current gain of the undoped semi-insulating GaAs. The concentration, depth and composition of the doped layer can be varied to produce switches with varying characteristics using known semiconductor technology.

In comparison to a diffuse discharge switch, the present invention is capable of higher current density in the switch, e.g., $10^3$ to $10^4$ A/cm$^2$, compared to less than 100 A/cm$^2$ in a diffuse discharge switch. Also, the forward voltage during conduction may be less than 100 volts, while the minimum forward voltage in a diffuse discharge switch is 1000 volts and over 100 volts in an EBS device. Most importantly, the current gain of an electron-beam controlled bulk semiconductor switch according to the present invention is $10^3$ to $10^4$, depending upon the source function and recombination rate of the semiconductor material 12. The source function $S_b$ defines the number of electron-hole pairs created per volume and time by the electron beam and is defined by equation (1).

$$\text{, TM } S_b = (dW/dx) * (J_b/e \; W_i) \quad (1)$$

In equation (1), dW/dx is the differential energy loss, $J_b$ is the electron-beam current density, e is the electron charge and $W_i$ is the effective ionization energy which is 4.3 eV for GaAs.

Figure 3:
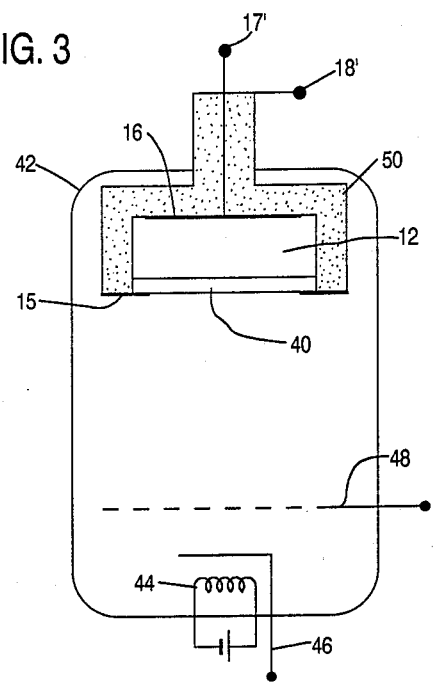
FIGS. 3 and 4 are schematic diagrams of third and fourth embodiments of the present invention, respectively.
Figure 4:
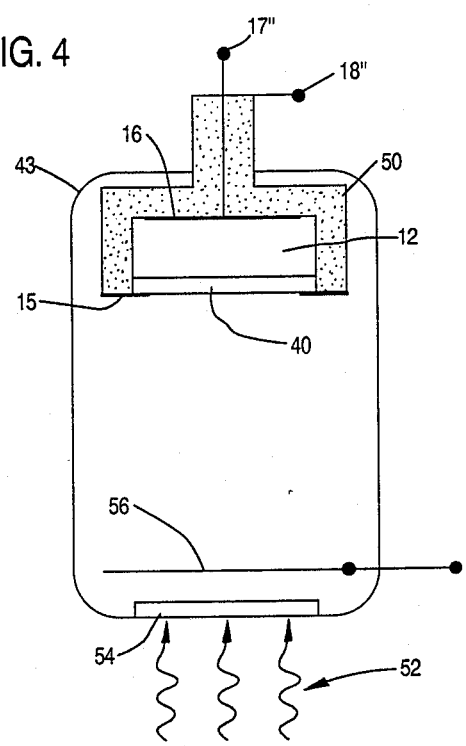

A semiconductor switch constructed according to the present invention can easily be integrated into a commercially available electron tube 42 or 43, as illustrated in FIGS. 3 and 4. In the embodiment illustrated in FIG. 3, the electron tube 42 is a vacuum tube containing a heater element 44, cathode 46, control gate 48 and anode 18'. The electrode 16 is connected to a switch terminal 17', while the semiconductor block 12 is supported by an insulator 50.

Planar electron tubes with plate voltages of up to 150 kV and electron current of 15 to 20 amps are available from Varian EIMAC in San Carlos, California, such as model number YU-140. The gate voltage applied to the control gate 48 of a 150 kV tube is less than 1 kV. An electron tube constructed as illustrated in FIG. 3 would be able to control currents between terminals 17' and 18' of 10 kA to 20 kA.

In the embodiment illustrated in FIG. 4, the vacuum tube 43 contains a photodiode in which light 52, which may be produced by a laser, passes through a window 54 to generate electrons from a photocathode 56. Multi-alkali photocathodes known in the industry by the designation S20 have a quantum efficiency of 0.1 or greater and thus convert 10 percent or more of received photons in visible light to electrons. The construction of the vacuum tube 43 at the anode end is essentially the same as that of the vacuum tube 42 illustrated in FIG. 3.

Photodiodes with diameters of two inches are available from International Telephone & Telegraph (ITT) in Fort Wayne, Ind., such as Model Number F4109. An advantage of using the photodiode tube 43 is the ability to generate pulses, having a pulse width of several nanoseconds controlled by a laser drawing one-tenth to one-hundredth of the power required for existing photoconductive high power switches.

An inductive energy discharge circuit can be produced using a semiconductor switch constructed according to the present invention. For example, using the embodiment illustrated in FIG. 4 where the semiconductor block 12 is 0.5 mm thick, a hold-off voltage of 50 kV could easily be maintained. Such as switch, controlled by a laser drawing less than 1 kW could be used to produce electrical power pulses of hundreds of megawatts from inductive storage. Furthermore, the amount of current supplied can be precisely controlled because the current increases linearly for increases in the area of the switch irradiated by the electron beam.

Many of the features and advantages of the present invention are apparent from the detailed specification, and thus, it is intended by the appended claims to cover all such features and advantages which fall within the spirit and scope of the invention. A switch constructed according to the present invention has many possible applications, a few of which include high power switching in, e.g., an inductive storage unit, and a bistable electronic device in, e.g., a high power circuit. Further, since numerous modifications and changes will readily occur to those skilled in the art, from the disclosure of the invention, it is not desired to limit the invention to the exact construction and operation illustrated and described. Accordingly, suitable modifications and equivalents may be resorted to, all falling within the scope and spirit of the invention.

What is claimed is:

1. A vacuum tube switching device, comprising:
    first and second terminals;
    a block of direct semiconductor material with a first contact on a first surface connected to the first terminal, a second contact on a second surface, opposite the first surface, connected to the second terminal and a doped region exposed by the first surface;
    electron beam means for directing an electron beam onto the first surface and into the doped region of said block to produce an electron-hole plasma between the first and second contacts by direct impact, recombination radiation and Bremsstrahlung, thereby permitting current to flow between the first and second terminals during irradiation of said block by the electron beam; and
    an enclosure, surrounding said block and said electron beam means, for maintaining pressure within said enclosure below atmospheric pressure, said first and second terminals extending beyond said enclosure.

2. A vacuum tube switching device as recited in claim 1, wherein said electron beam means comprises:
    a heated cathode within said enclosure for generating electrons;
    a control gate, disposed between said heated cathode and said block within said enclosure, for controlling the flow of electrons; and
    third and fourth terminals extending beyond said enclosure, connected to said heated cathode and said control gate, respectively.

3. A vacuum tube switching device as recited in claim 1, wherein said block has a thickness, measured between the first and second contacts, of 0.5 millimeter to 10 millimeters and the doped region extends from the first surface into said block for a distance of between 1 and 100 micrometers.

4. A vacuum tube switching device as recited in claim 1, wherein said electron beam means comprises:
    a photocathode for converting light into electrons to produce the electron beam;
    a window for transmitting light from outside said enclosure to said photocathode; and
    a third terminal, connected to said photocathode, extending beyond said enclosure.

5. A vacuum tube switching device as recited in claim 2,
    wherein said heated cathode is a planar plate with a voltage of 10 to 150 kilovolts thereacross, producing electrons with 10 to 150 kiloelectron volts,
    wherein the current density conducted by said block of semiconductor material between said first and second terminals when the electron beam irradiates the first surface of said block is between 1 and 10,000 amps/cm$^2$.

6. A vacuum tube switching device as recited in claim 3, wherein the semiconductor material is one of gallium arsenide, and indium phosphide and the doped region contains one of zinc, cadmium, carbon, beryllium, magnesium, lithium, tellurium, selenium, tin, sulfur, silicon and germanium.

7. A vacuum tube switching device as recited in claim 6, wherein the doped region contains one of a donor and an acceptor with a concentration of $10^{17}$ to $10^{20}$ per cubic centimeter.

8. A vacuum tube switching device as recited in claim 4,
    wherein said photocathode is constructed of a multi-alkali compound, wherein said third terminal receives a voltage of 10 to 150 kV; and wherein the current density conducted by said block of semiconductor material between said first and second terminals is between 1 and 10,000 amps/cm$^2$.

9. A vacuum tube switching device as recited in claim 4, further comprising a laser, outside said enclosure, generating a laser beam directed at said photocathode through said window to make said block conductive.

10. A vacuum tube switching device as recited in claim 9, wherein said laser is a visible light laser.

11. An inductive storage system, comprising:

inductive storage means for storing electricity; and a vacuum tube switching device for supplying electrical pulses to and from said inductive storage means to charge and discharge, respectively, said inductive storage means, said vacuum tube switching device comprising:

first and second terminals;

a block of direct semiconductor material with a first contact on a first surface connected to the first terminal, a second contact on a second surface, opposite the first surface, connected to the second terminal and a doped region exposed by the first surface;

electron beam means for directing an electron beam onto the first surface and into the doped region of said block to produce an electron-hole plasma between the first and second contacts by direct impact, recombination radiation and Bremsstrahlung, thereby permitting current to flow between the first and second terminals during irradiation of said block by the electron beam; and an enclosure, surrounding said block and said electron beam means, for maintaining pressure within said enclosure below atmospheric pressure, said first and second terminals extending beyond said enclosure.

* * * * *